(12) United States Patent
Le et al.

(10) Patent No.: US 6,292,399 B1
(45) Date of Patent: Sep. 18, 2001

(54) METHOD AND LOW-POWER CIRCUITS USED TO GENERATE ACCURATE DRAIN VOLTAGE FOR FLASH MEMORY CORE CELLS IN READ MODE

(75) Inventors: Binh Q. Le, San Jose; Pau-Ling Chen; Michael A. Van Buskirk, both of Saratoga, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/609,897

(22) Filed: Jul. 3, 2000

(51) Int. Cl.[7] .................................................. G11C 16/06
(52) U.S. Cl. .............................. 365/185.21; 365/189.07; 365/189.09
(58) Field of Search ............................. 365/226, 185.21, 365/185.2, 189.07, 189.09

(56) References Cited

U.S. PATENT DOCUMENTS 5,706,240 * 1/1998 Fiocchi ........................... 365/189.09
5,757,700 * 5/1998 Kobayashi ...................... 365/230.01
5,905,677 * 5/1999 Casagrande ..................... 365/185.23

* cited by examiner

*Primary Examiner*—A. Zarabian
(74) *Attorney, Agent, or Firm*—Davis Chin

(57) ABSTRACT

Control circuitry and a method for generating an accurate drain voltage for selected memory core cells in a semiconductor memory device during a Read mode of operation is provided. Select gate transistors are provided which have their conduction path being coupled between a power supply voltage and a drain of one of the selected memory core cells. A differential amplifier circuit is responsive to a bitline voltage corresponding to a drain voltage of the selected memory core cells and a reference voltage for generating a select gate voltage. The select gate voltage is decreased when the bitline voltage is higher than a target voltage and is increased when the bitline voltage is lower than the target voltage. A source follower circuit is responsive to the select gate voltage for generating the bitline voltage which is maintained at the target voltage. The control gates of the select gate transistors are connected to receive the select gate voltage for maintaining the voltage at the drain of the selected memory core cells to be approximately constant.

12 Claims, 5 Drawing Sheets

METHOD AND LOW-POWER CIRCUITS USED TO GENERATE ACCURATE DRAIN VOLTAGE FOR FLASH MEMORY CORE CELLS IN READ MODE

BACKGROUND OF THE INVENTION

This invention relates generally to floating gate memory devices such as an array of Flash electrically, erasable programmable read-only memory (EEPROM) cells. More particularly, the present invention relates to a control circuit for generating an accurate drain voltage for memory core cells during a Read mode of operation.

As is generally known in the art, there exists a class of non-volatile memory devices referred to as "Flash EEPROMs" which has recently emerged as an important memory device by combining the advantages of EPROM density with EEPROM electrical erasability. Such Flash EEPROMs provide electrical erasing and a small cell size. In a conventional Flash EEPROM memory device, a plurality of one-transistor core cells may be formed on a semiconductor substrate in which each cell is comprised of a P-type conductivity substrate, an N-type conductivity source region formed integrally with the substrate, and an N-type conductivity drain region also formed integrally within the substrate. A floating gate is separated from the substrate by a thin dielectric layer. A second dielectric layer separates a control gate from the floating gate. A P-type channel region in the substrate separates the source and drain regions.

One type of architecture used for Flash memories is typically referred to as a NOR Flash memory architecture which is an array of Flash EEPROM cells (floating gate devices) which are divided into a plurality of sectors. Further, the memory cells within each sector are arranged in rows of wordlines and columns of bitlines intersecting the rows of wordlines. The source region of each cell transistor within each sector is tied to a common node. Therefore, all of the cells within a particular sector can be erased simultaneously and erasure may be performed on a sector-by-sector basis. The control gates of the cell transistors are coupled to wordlines, and the drains thereof are coupled to bit lines.

In order to program the Flash EEPROM cell in conventional operation, the drain region and the control gate are raised to predetermined potentials above the potential applied to the source region. For example, the drain region has applied thereto a voltage $V_D$ of approximately +5.5 volts with the control gate $V_G$ having a voltage of approximately +9 volts applied thereto. These voltages produce "hot electrons" which are accelerated across the thin dielectric layer and onto the floating gate. This hot electron injection results in an increase of the floating gate threshold by approximately two to four volts.

For erasing the Flash EEPROM cell in conventional operation, a positive potential (e.g., +5 volts) is applied to the source region. The control gate is applied with a negative potential (e.g., −8 volts), and the drain region is allowed to float. A strong electric field develops between the floating gate and the source region, and a negative charge is extracted from the floating gate to the source region by way of Fowler-Nordheim tunneling.

In order to determine whether the Flash EEPROM cell has been properly programmed or not, the magnitude of the read current is measured. Typically, in the read mode of operation the source region is held at a ground potential (0 volts) and the control gate is held at a potential of about +5 volts. The drain region is held at a potential between +1 to +2 volts. Under these conditions, an unprogrammed cell (storing a logic "1") will conduct a current level approximately 50 to 100 $\mu$A. The programmed cell (storing a logic "0") will have considerably less current flowing.

In FIG. 1, there is shown a simplified block diagram of a conventional semiconductor integrated circuit memory device 10 which includes a cell matrix 12 formed of a plurality of memory core cells MC11 . . . MCnm arranged in rows and columns. The cell matrix 12 is accessed by row address signals $A_i$ and column address signals $A_j$. A row decoder 14 is responsive to the row address signals $A_i$ for selecting one of the wordlines WL1 . . . WLn. At the same time, a column decoder 16 is responsive to the column address signals $A_j$ for generating column selection signals CS1 . . . CSm. The gates of the column selection transistors CST1 . . . CSTm are connected to a respective one of the column selection signals CS1 . . . CSm. The drains of the column selection transistors CST1 . . . CSTm are all connected together and to a common node A. Each of the sources of the column selection transistors is coupled via respective select gate transistors SG1 . . . SGm to one of the plurality of bitlines BL1 . . . BLm which are arranged to intersect the rows of wordlines WL1 . . . WLm. The gates of the select gate transistors SG1 . . . SGm are all connected together and further connected to receive a select gate voltage SEL.

Further, each of the memory core cells MC11 . . . MCnm is comprised of one of the corresponding floating gate core cell transistors $Q_{P11}$–$Q_{Pnm}$. Each of the control gates of the cores transistors is connected to one of the corresponding rows of wordlines WL1 . . . WLn, each of the drains (node D) thereof is connected to one of the corresponding columns of bitlines BL1 . . . BLm, and each of the sources thereof is connected to an array ground potential VSS. The node A is connected to an external power supply voltage VCC, which is typically in the range of +2.5 V to +3.6 V and is dependent upon temperature. The node A is also connected to a sense amplifier circuit 18 for sensing the data during the Read mode of operation.

When the data stored in a memory core cell such as the cell MC11 is to be sensed during the reading mode, the gate of the column selection transistor CST1 is set to a high voltage by the column decoder 16 and the gate of the select gate transistor SG1 is also selected to be at a high voltage. Thus, the power supply voltage VCC will be passed to the drain at the node D of the memory core transistor $Q_{P11}$. At the same time, the wordline WL1 will be set to a high voltage level by the row decoder 14. As a result, the control gate and the drain of the selected memory core cell MC11 are both set to a high voltage. In this way, the data on the corresponding bitline BL1 is applied to the sense amplifier circuit 18.

In order to avoid the problem of a read disturb, it is generally known that the voltage at the drain (node D) of the selected core cell transistor must not be higher than a predetermined voltage (for example, +1.7 volts) dependent upon the technology used. If it is assumed that the read current for an erased cell is 40 $\mu$A and that sixteen (16) such cells are read at once, then a total read current of 16×40$\mu$A or 0.64 mA is required to be supplied. However, it is difficult to create an accurate voltage of +1.7 V at the node D from a power supply of only +2.6 V at the node A with a load current of 0.64 mA in a very short amount of time (about 30 nS).

In view of this, there has arisen a need of providing a way of generating an accurate drain voltage for selected memory core cells during a Read mode of operation on an efficient and effective basis. This is accomplished in the present invention by accurately controlling a select gate voltage which is applied to the gates of the select gate transistors whose sources are connected to corresponding drains of the selected memory core transistors during Read.

SUMMARY OF THE INVENTION

Accordingly, it is a general object of the present invention to provide an apparatus and a method for generating an accurate drain voltage for selected memory core cells during a Read mode of operation which overcomes the problems of the prior art.

It is an object of the present invention to provide an apparatus and a method for generating an accurate drain voltage for selected memory core cells during a Read mode of operation on an efficient and effective basis.

It is another object of the present invention to provide control circuitry and a method for generating an accurate drain voltage for selected memory core cells during a Read mode of operation which has low power consumption.

It is still another object of the present invention to provide control circuitry and a method for generating an accurate drain voltage for selected core memory cells during a Read mode of operation which includes differential amplifier circuit means responsive to a bitline voltage corresponding to a drain voltage of the selected memory core cells and a reference voltage for generating a select gate voltage which is decreased when the bitline voltage is higher than a target voltage and which is increased when the bitline voltage is lower than the target voltage.

In accordance with a preferred embodiment of the present invention, there is provided a control circuit for generating an accurate drain voltage for selected memory core cells in a semiconductor memory device during a Read mode of operation. Select gate transistors are provided which have their conduction paths being coupled between a power supply voltage and a drain of one of the selected memory core cells. A differential amplifier circuit is responsive to a bitline voltage corresponding to a drain voltage of the selected memory core cells and a reference voltage so as to generate a select gate voltage which is decreased when the bitline voltage is higher than a target voltage and which is increased when the bitline voltage is lower than the target voltage. An source follower circuit is responsive to the select gate voltage for generating the bitline voltage which is maintained at the target voltage. The control gates of the select gate transistors are connected to receive the select gate voltage for maintaining the voltage at the drain of the selected memory core cells to be approximately constant.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 3 is a detailed schematic circuit diagram of booster circuit 300 for use in FIG. 2;

FIG. 4 is a schematic circuit diagram of a level-shifting circuit 400 for use in FIG. 3;

FIG. 5 is a schematic circuit diagram of a select gate decoder 500 for use in FIG. 2;

FIG. 6 is a schematic circuit diagram of a bias generator circuit 600 for use in FIG. 2;

FIG. 7 is a schematic circuit diagram of a reference generator circuit 700 for use in FIG. 2.

DESCRIPTION OF THE PREFERRED EMBODIMENT

Control circuitry and a method for generating an accurate drain voltage for selected memory core cells during a Read mode of operation are described. In the following description, numerous specific details are set forth, such as specific circuit configurations, components, and the like in order to provide a thorough understanding of the present invention. However, it should be apparent to those skilled in the art that the present invention may be practiced without the specific details. In other instances, well-known processes, circuits, and control lines not particularly relevant to the understanding of the operating principles of the present invention, have been purposely omitted for the sake of clarity.

Figure 1:
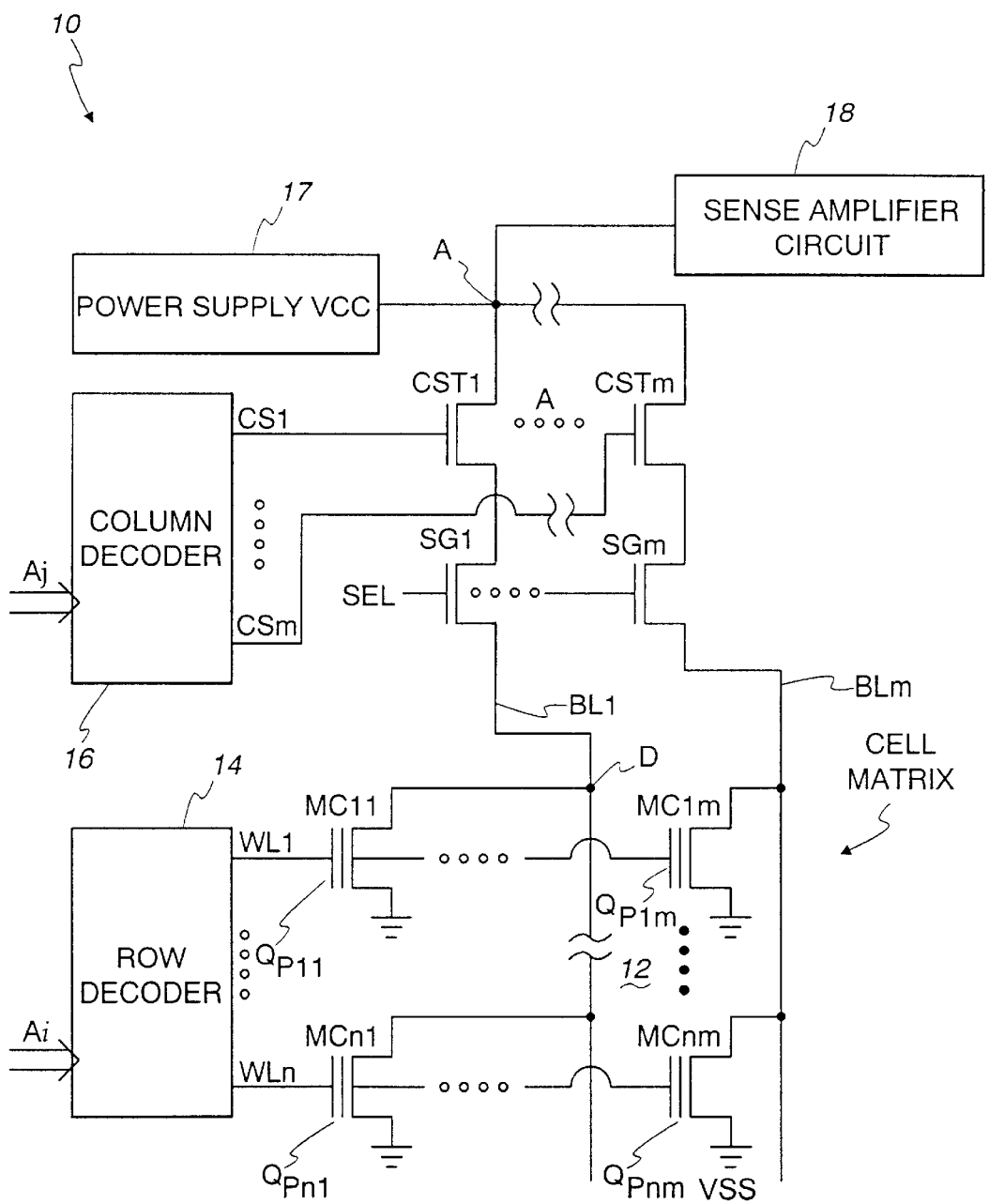
FIG. 1 is a simplified block diagram of a conventional EEPROM memory device.

As previously pointed out, it is very hard to generate an accurate voltage (e.g., +1.7 V) at the drain (node D) of the selected memory core cell MC11 of FIG. 1 with a load current of 0.64 mA in a very short amount of time (about 30 nS) from a power supply voltage VCC of only +2.6 volts. Thus, the purpose of this invention is to provide an apparatus and method of creating an accurate drain voltage for the selected memory core cells during a Read mode of operation, but does not consume a large amount of current. In view of this, the inventors of the present invention have developed a way of regulating the drain voltage of the selected memory core cells, which are connected to the corresponding sources of the select gate transistors SG1 . . . SGm by controlling the control gate voltage SEL of the select gate transistors.

Referring back to FIG. 1, it will be noted however that the current $I_{read}$ flowing through the select gate transistor SG1 is governed by the square rule law and can be expressed as follows:

$$I_{read}=K(V_{SEL}-V_D-V_T)^2$$

where:

K is a constant for a particular gate size $V_{SEL}$ is the control gate voltage applied to the select gate transistor $V_T$ is the threshold voltage of the select gate transistor (with body effect)

$V_D$ is the drain voltage of the selected memory core transistor

It should be apparent to those skilled in the art that the factor K is dependent upon process corners and temperature. Likewise, the threshold voltage $V_T$ of the select gate transistor SG1 varies with process corners and temperature and will not be constant. In addition, in order to maintain an approximately constant drain voltage at the node D, the select gate voltage SEL may be required under certain conditions to be generated to be greater than the power supply voltage VCC. Therefore, in order to overcome all of these problems so as to avoid the read disturb effect and maintain the drain voltage at a constant level during the Read mode, there has been developed a feedback amplifier circuitry of a unique configuration, constructed in accordance with the principles of the present invention.

Figure 2:
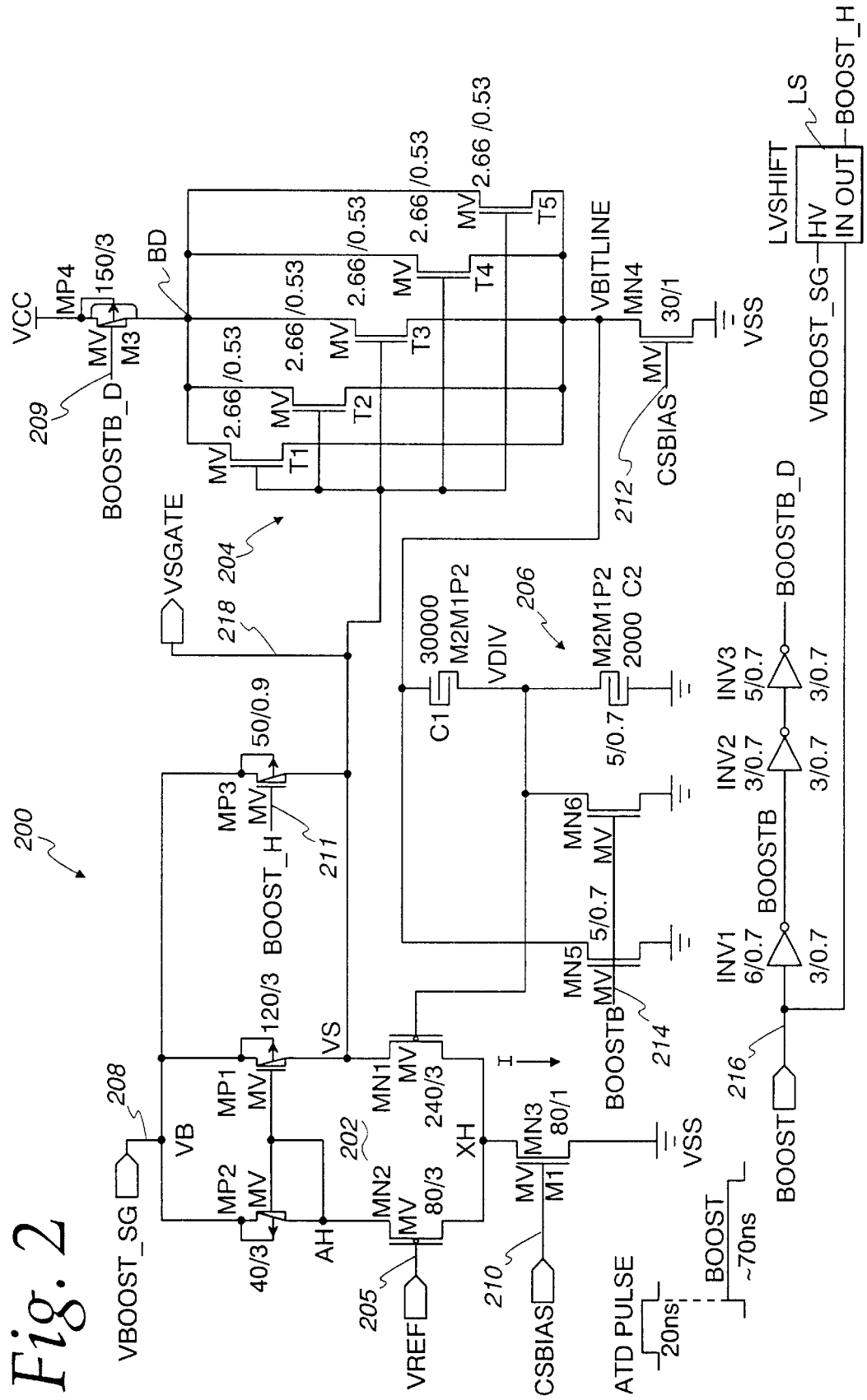
FIG. 2 is a schematic circuit diagram of feedback amplifier circuitry for use with select gate transistors in FIG. 1, constructed in accordance with the principles of the present invention.

Referring now in detail to the drawings, there is shown in FIG. 2 a detailed schematic circuit diagram of feedback amplifier circuitry 200 for use with the select gate transistors SG1 . . . SGm of FIG. 1. The feedback amplifier circuitry 200 includes an unbalanced differential amplifier circuit 202, a source follower network 204, and a capacitor divider network 206. The differential amplifier circuit 202 consists of NMOS input transistors MN1, MN2; PMOS load transistors MP1, MP2; a current source transistor MN3; and a pre-charge transistor MP3. The first input transistor MN1 has its gate connected to a node VDIV from the capacitor divider network 206, its drain connected to a node VS, and its source connected to the drain of the current source transistor MN3 at node XH. The second input transistor MN2 has its gate connected to receive a stable reference voltage VREF on line 205, its drain connected to a node AH, and its source connected also to the drain of the current source transistor MN3. The reference voltage VREF is generated by a reference generator circuit 700 of FIG. 7 which will be explained hereinbelow and produces a reference voltage of typically +1.3 volts.

The first load transistor MP1 has its source connected to a node VB for receiving a boosted voltage VBOOST_SG on line 208, its drain connected to the node VS, and its gate connected to the node AH. The second load transistor MP2 has its source connected also to the node VB and its drain and gate connected also to the node AH. The boosted voltage VBOOST_SG is generated by a booster circuit 300 of FIG. 3, which will be explained more fully hereinafter and is in the range of typically +4.4 V to +6.3 V.

The current source transistor MN3 has its drain connected to the node XH, its source connected to a ground potential VSS (0 volts), and its gate connected to receive a bias voltage CSBIAS on line 210. The bias voltage CSBIAS is generated by a bias generator circuit 600 of FIG. 6, which will be described later and is in the range of +1.0 V to +1.5 V. The pre-charge transistor MP3 has its source connected to the node VB, its drain connected to the node VS, and its gate connected to receive a boost signal BOOST_H on line 211.

The source follower network 204 includes a power-down transistor MP4 and a plurality of parallel-connected select transistors T1–T5 which are formed of the same type and size as the select gate transistors SG1 . . . SGm (FIG. 1), and a current source transistor MN4. The transistors T1–T5 have all of their drains connected together and to a node BD. All of the sources of the transistors T1–T5 are connected together and to a node VBITLINE. All of the gates of the transistors T1–T5 are connected together and to the node VS. The power-down transistor MP4 has its source connected to a power supply voltage VCC, its drain connected to the node BD, and its gate connected to receive a delayed, complement signal BOOSTB_D on line 209. The current source transistor MN4 has its drain connected to the node VBITLINE, its source connected to the ground potential, and its gate connected to receive the bias voltage CSBIAS on line 212. The power supply voltage VCC is in the range of +2.6 V to +3.6 V. Since the current source transistor MN4 has a current flowing therethrough which mimics the total read current of five erased cells, the voltage at the node VBITLILNE will be approximately equal to the voltage at the drain (node D) of the selected memory core cells in FIG. 1.

The capacitor divider network 206 is formed of a first capacitor C1 and a second capacitor C2 connected in series with the first capacitor C1 at the node VDIV. The other end of the first capacitor C1 is connected to receive a target voltage at the node VBITLINE, which corresponds to the drain voltage at the node D (FIG. 1) of the selected memory core cell MC11. The other end of the second capacitor C2 is connected to the ground potential. A first discharge transistor MN5 has its drain connected to the first capacitor C1 at the node VBITLINE and its source connected to the ground potential. A second discharge transistor MN6 has its drain connected to the junction of the first and second capacitors at the node VDIV defining a feedback voltage and its source connected to the ground potential. The gates of the first and second discharge transistors MN5, MN6 are connected together and receives the inverted boost signal BOOSTB on line 214.

Figures 3, 4:
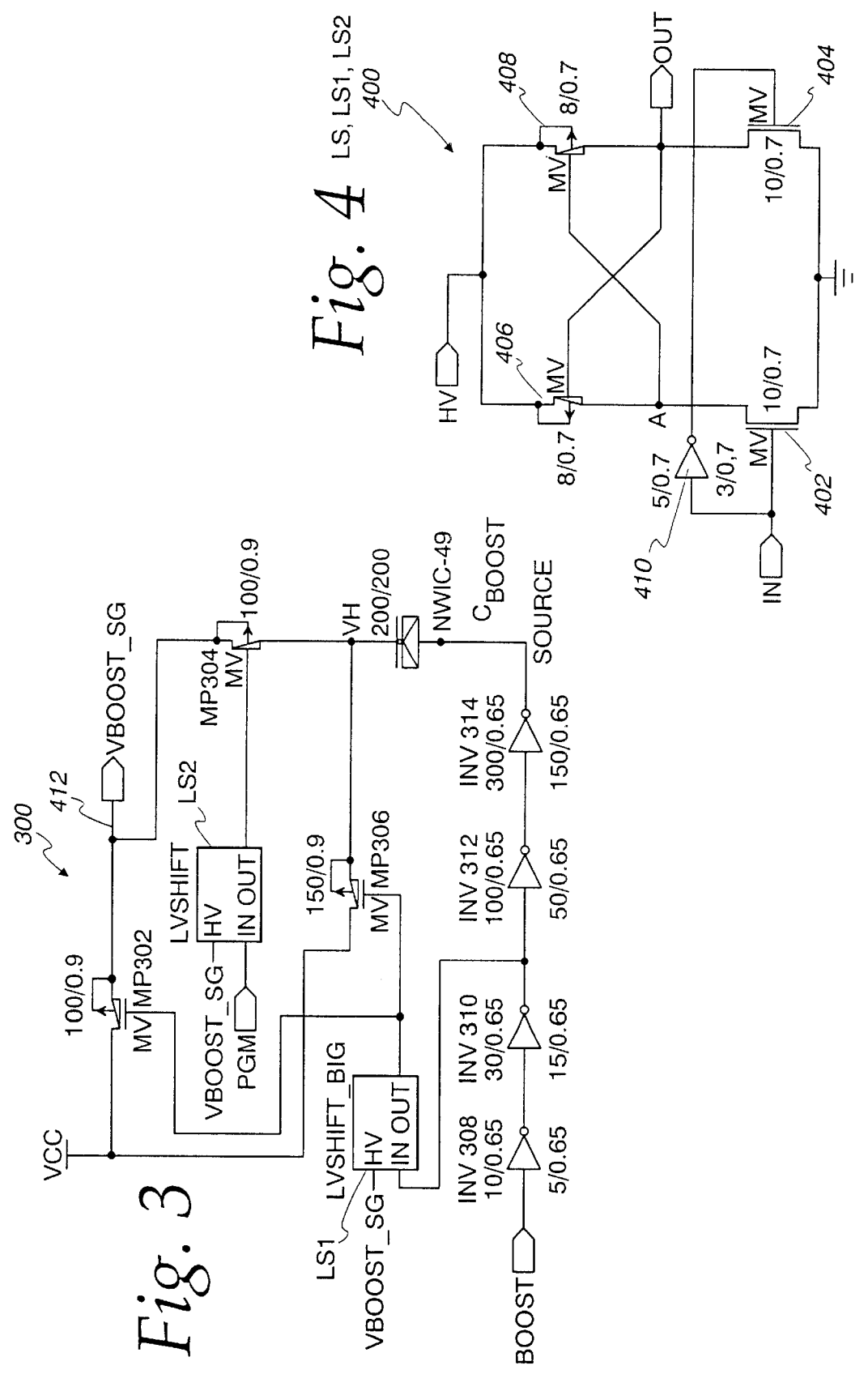

The feedback amplifier circuitry 200 further includes an inverter INV1 which has its input connected to receive a boost signal BOOST on line 216 and its output provides the complement boost signal BOOSTB. An inverter INV2 has its input connected to the output of the inverter INV1 and its output connected to the input of the inverter INV3. The output of the inverter INV3 generates the delayed, complement boost signal BOOSTB_D. A level-shifting circuit LS has its input terminal connected to receive also the boost signal BOOST and provides on its output the level-shifted boost signal BOOST_H. A detailed schematic circuit diagram of the level-shifter circuit LS is shown in FIG. 4 and will be described more fully hereinbelow. It will be noted that the boost signal BOOST is at a low level during the ATD pulse having a period of 20 nS and is at a high level for about 70 nS beginning on the falling edge of the ATD pulse.

Referring now to FIG. 3, there is illustrated a detailed schematic circuit diagram of the booster circuit 300 which generates the boosted voltage VBOOST_SG of +4.4 V to +6.3 V in response to the boost signal BOOST (FIG. 2). The booster circuit 300 includes PMOS transistors MP302, MP304 and MP306; two identical level-shifter circuits LS1, LS2; inverters INV308, INV310, INV312, INV314; and a boost capacitor $C_{boost}$. It will be noted that the level-shifter circuits LS1 and LS2 are identical to the level-shifter circuit LS of FIG. 2. A detailed schematic circuit diagram of a level-shifter 400 for use in FIGS. 2 and 3 is depicted in FIG. 4.

The level-shifter circuit 400 is comprised of a pair of NMOS input transistors 402, 404; a pair of cross-coupled PMOS load transistors 406, 408; and an inverter 410. During the ATD period, all of the transistors MP302, MP304 and MP306 (FIG. 3) are turned ON since the signal on the output terminal OUT (FIG. 4) will be low. As a result, the voltage on the node VH and the output line 412 will be pre-charged to the power supply voltage VCC between +2.6 V to +3.6 V. When the boost signal BOOST goes to a high level, the node VH and the boosted voltage VBOOST_SG on the line 412 will be boosted from the power supply voltage VCC to a higher voltage.

Referring back to FIG. 2, it should be noted that the boosted voltage VBOOST_SG is connected to parasitic capacitance associated with a select gate N-well loading region and thus has a heavy capacitive loading (about 30 pF). Therefore, in order to reduce the loading at the node VS so as to increase the charging current, the select gate voltage VSGATE is separated from the boosted voltage VBOOST_SG which reduces the loading at the node VS to about 8 pF. This is accomplished by the select gate decoder 500 of FIG. 5 which is a detailed schematic circuit diagram thereof.

The select gate decoder circuit 500 receives via a multiplexer (not shown) on line 50 an N-well signal VPSGH, which is at the same level as the boosted voltage VBOOST_SG and receives on line 52 a select gate signal VPSG, which is at the same level as the select gate voltage VSGATE. The decoder 500 passes a select gate voltage SEL on line 54. The decoder 500 includes a pair of cross-coupled P-channel transistors 502, 504 and an output transistor 506. The sources and the N-well regions of the transistors 502, 504 are connected together and to receive the N-well signal VPSGH. The gate of the transistor 502 and the drain of the transistor 504 are connected together at a node SELB. The gate of the transistor 504 and the drain of the transistor 502 are connected together at a node NN1. The output transistor 506 has its N-well region connected also to receive the N-well signal VPSGH and its source connected to receive the select gate signal VPSG. Thus, the signal VPSG has been isolated from the signal VPSGH since the source and the N-well region of the transistor 506 have been separated from each other and its source is not tied to the signal VPSGH. The gate of the transistor 506 is also connected to the node SELB and the drain thereof is connected to the line 54 for providing the select gate voltage SEL. For a detailed discussion of the technique for capacitive loading reduction, reference is made to Ser. No. 09/593,303 filed on Jun. 13, 2000, and entitled "Method to Reduce Capacitive Loading in Flash Memory X-Decoder for Accurate Voltage Control at Wordlines and Select Lines." This application Ser. No. 09/593,303 is assigned to the same assignee as the present invention and is hereby incorporated by reference.

Since it is desired to charge up quickly the voltage VSGATE on the output line 218 (FIG. 2) without increasing the bias current for the differential amplifier circuit 202, the differential amplifier circuit has been purposely designed to be unbalanced so as to provide fast charging time with a low bias current. As can be seen, the size of the transistors MP1, MN1 on the right side is n times larger than the transistors MP2, MN2 on the left side. As a result, there will be created approximately n times the bias current I flowing through the transistor MP1 for charging up the node VS.

Figures 5, 6, 7:
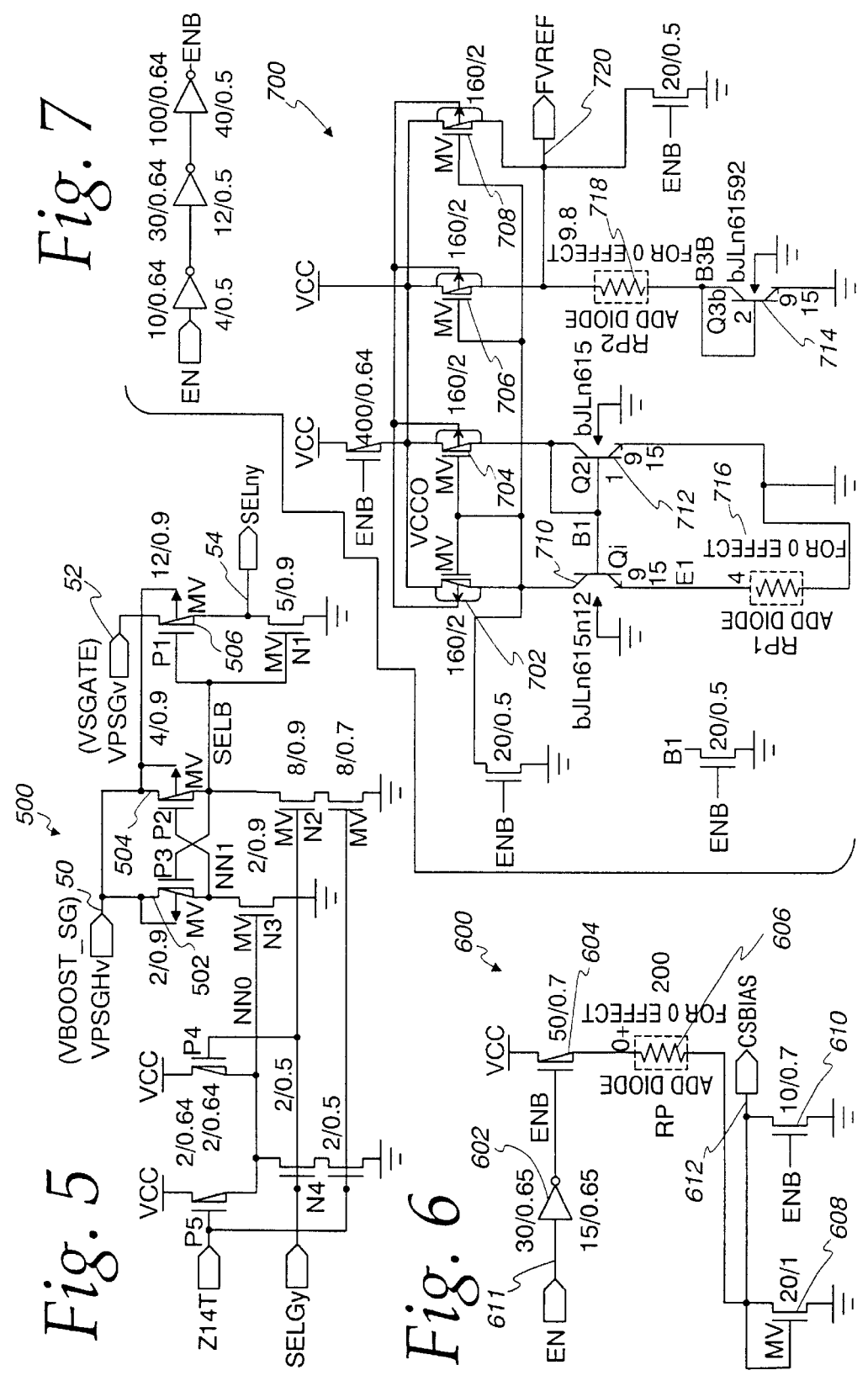

With respect to FIG. 6, there is illustrated a schematic circuit diagram of the bias generator 600 for generating the bias voltage CSBIAS which is connected to the gates of the current source transistors MN3, MN4 of FIG. 2. The bias generator circuit 600 is formed of an inverter 602, a PMOS transistor 604, a resistor 606, and NMOS transistors 608, 610. When the enable signal EN on line 611 is at a high level, the transistor 604 will be turned ON so as to cause a current to flow through the resistor 606 and the transistor 608. As a result, the bias voltage CBIAS will be generated on line 612 which is approximately +1.0 V to +1.5 V.

In FIG. 7, there is shown a detailed schematic circuit diagram of the reference generator circuit 700 for generating the stable reference voltage VREF of +1.3 V which is connected to the gate of the second input transistor MN2 on the line 205 (FIG. 2). The reference generator 700 includes PMOS current mirror transistors 702, 704, 706, 708; bipolar transistors 710, 712, 714 and resistors 716, 718. The current in the bipolar transistors 710, 712 will be reflected to flow through the resistor 718 and the bipolar transistor 714 so as to create the stable reference voltage VREF on line 720. The reference voltage VREF varies about 80 mV.

Figure 8:
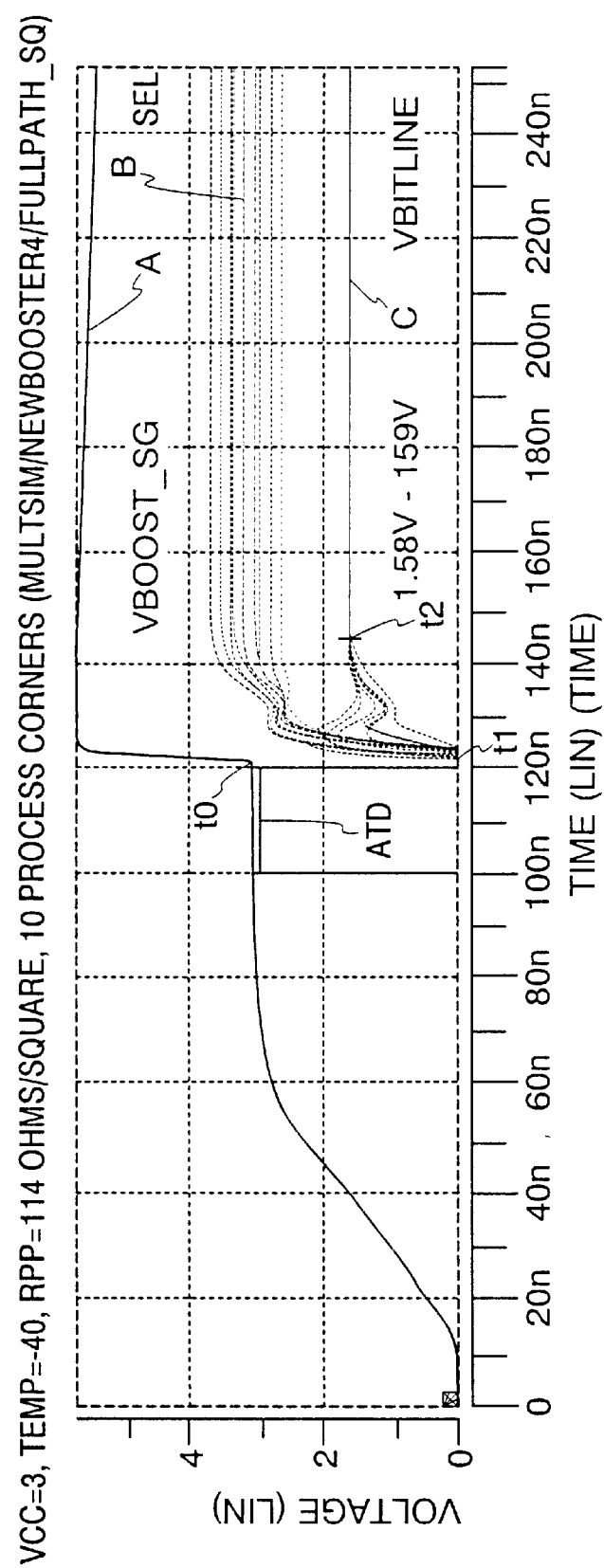
FIG. 8 are waveforms at various points in the circuit of FIG. 2, useful in explaining the operation of the present invention.

The operation of the feedback amplifier circuitry 200 of the present invention depicted in FIG. 2 for use with the select gate transistors SG1 . . . SGm of FIG. 1 will now be explained with reference to the waveforms in FIG. 8. Initially, it will be noted that the feedback circuitry 200 is enabled during the ATD pulse period and thus the boosted signal VBOOST_SG (curve A of FIG. 8) is pre-charging towards the power supply voltage VCC (e.g., +3.0 volts) when the ATD pulse ends at time t0.

At the beginning of the ATD pulse which is prior to the time t0, the enable signal EN will go high so as to cause the stable reference voltage VREF to charge up quickly and is settled to about +1.3 volts after 20 nS. Since the transistor MP3 will be turned ON, the node VS will also settle to the power supply voltage VCC. At the end of ATD pulse or the time t0, the boost signal BOOST will go high. Further, the select gate decoder 500 (FIG. 5) is selected by applying a high logic level to nodes Z14T and SELG a short time after the boost signal BOOST goes high. As a consequence, the transistor 506 will be turned ON so as to cause the select gate voltage SEL on the line 54 (curves B) to start going up at time t1. The voltage at the node VBITLINE (curve C), which is approximately equal to the voltage at the node D of FIG. 1, will also be going high until it reaches the target voltage (i.e., +1.5 V) at time t2 in FIG. 8. The values of the capacitors C1 and C2 are selected so that the feedback voltage at the node VDIV is at +1.3 V (equal to the reference voltage VREF) when the target voltage at the node VBITLINE is reached at the time t2. Thus, the stable reference voltage VREF of +1.3 V is used to define the target voltage at the node VBITLINE. It should be noted that while the feedback amplifier circuitry 200 is enabled during the ATD pulse period, the select gate decoder is not activated until after the boost signal BOOST goes high in order to avoid overshooting the voltage at the drain (node D) of the selected memory core cells MC11 . . . MCnm.

Now, assume that the voltage at the node VBITLINE is at +1.7 V (higher than the target voltage of +1.5 V). This will cause the voltage fed back from the node VDIV to be higher than the reference voltage VREF of +1.3 V and will render the transistor MN1 to be more conductive. Further, the transistor MN2 will become less conductive and the voltage at the node AH will go higher so as to cause less conduction in the transistor MP1. This will, in turn, cause the voltage at the node VS to be lower, which is fed to the gates of the transistors T1–T5 so as to render them less conductive. Thus, the voltage at the node VBITLINE will be lowered toward the target voltage. On the other hand, if the node VBITLINE is at +1.3 V, then the opposite will occur in the differential amplifier circuit 202 so as to raise the voltage towards the target voltage of +1.5 V. In this manner, it can be seen that the voltage at the node VBITLINE is regulated accurately to be at +1.5 V which is approximately equal to the voltage at the node D at the drain of the selected memory core cell.

From the foregoing detailed description, it can thus be seen that the present invention provides control circuitry and a method for generating an accurate drain voltage for selected memory core cells during a Read mode of operation. The control circuitry of the present invention includes feedback amplifier circuitry for generating a select gate voltage which is applied to control gates of select gate transistors for maintaining the voltage at the drain of the selected memory core transistor to be approximately constant.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A control circuit for generating an accurate drain voltage for selected memory core cells in a semiconductor memory circuit during a Read mode of operation, said control circuit comprising:

selected gate transistors each having its conductive path being coupled between a power supply voltage and a drain of one of the selected memory core cells;

differential amplifier means responsive to a bitline voltage corresponding to a drain voltage of the selected memory core cells and a reference voltage for generating a select gate voltage which is decreased when the bitline voltage is higher than a target voltage and which is increased when the bitline voltage is lower than the target voltage;

said differential amplifier circuit means including a first input transistor having its gate connected to a stable reference voltage and a second input transistor having its gate coupled to a feedback voltage which is proportional to the bitline voltage, the second input transistor having its collector providing the select gate voltage;

a capacitor divider network formed of a first capacitor and a second capacitor connected in series between the bitline voltage and a ground potential, the junction of said first and second capacitors providing the feedback voltage;

source follower circuit means responsive to the select gate voltage for generating the bitline voltage which is maintained at the target voltage;

said source follower circuit means being formed of a plurality of transistors whose drains are coupled together and to the power supply potential, gates are connected together and to receive the select gate voltage, and sources are connected together and to provide the bitline voltage; and the control gates of the select gate transistors being connected to receive said select gate voltage for maintaining the voltage at the drain of the selected memory core cells to be approximately constant.

2. A control circuit for generating an accurate drain voltage as claimed in claim 1, further comprising a first constant current source transistor having its drain connected to the sources of said first and second input transistors, its source connected to the ground potential, and its gate connected to receive a bias voltage.

3. A control circuit for generating an accurate drain voltage as claimed in claim 2, further comprising reference voltage generator means for generating the stable reference voltage.

4. A control circuit for generating an accurate drain voltage as claimed in claim 3, further comprising bias generator means for generating the bias voltage.

5. A control circuit for generating an accurate drain voltage as claimed in claim 4, further comprising a second current source transistor having its drain connected to receive the bitline voltage, its source connected to the ground potential, and its gate connected to receive the bias voltage.

6. A control circuit for generating an accurate drain voltage as claimed in claim 1, wherein the size of the second input transistor is n times larger than the size of the first input transistor so as to create an unbalanced differential amplifier circuit.

7. A control circuit for generating an accurate drain voltage as claimed in claim 1, wherein said power supply voltage is in the range of +2.6 V to +3.6 V.

8. A control circuit for generating an accurate drain voltage as claimed in claim 7, wherein the reference voltage is approximately +1.3 V.

9. A control circuit for generating an accurate drain voltage as claimed in claim 8, wherein the target voltage is approximately +1.5 V.

10. A control circuit for generating an accurate drain voltage as claimed in claim 1, wherein the feedback voltage is substantially equal to the reference voltage when the bitline voltage is at the target voltage.

11. A control circuit for generating an accurate drain voltage as claimed in claim 1, wherein the drains of said first and second input transistors are coupled to a boosted voltage.

12. A control circuit for generating an accurate drain voltage as claimed in claim 11, wherein said boosted voltage is in the range of +4.4 V to +6.3 V.

* * * * *